United States Patent [19]
Proctor, Jr.

[11] Patent Number: 6,078,216
[45] Date of Patent: Jun. 20, 2000

[54] ALIASED WIDE BAND PERFORMANCE MONITOR FOR ADJUSTING PREDISTORTION AND VECTOR MODULATOR CONTROL PARAMETERS OF RF AMPLIFIER

[75] Inventor: James Arthur Proctor, Jr., Los Gatos, Calif.

[73] Assignee: Spectrian Corporation, Sunnyvale, Calif.

[21] Appl. No.: 09/053,529

[22] Filed: Mar. 31, 1998

[51] Int. Cl.[7] .......................................................... H03F 1/32
[52] U.S. Cl. ........................................... 330/151; 330/149
[58] Field of Search .................................. 330/149; 55/151

[56] References Cited

U.S. PATENT DOCUMENTS 5,485,120  1/1996  Anvari ..................................... 330/151
5,515,000  5/1996  Maruyama et al. ...................... 330/52

OTHER PUBLICATIONS

Grant et al. "A DSP Controlled Adaptive Feedforward Amplifier Linearizer" IEEE pp 788–792, 1996.

*Primary Examiner*—Michael B Shingleton
*Attorney, Agent, or Firm*—Charles E. Wands

[57] ABSTRACT

A digital signal processor-resident RF power amplifier performance monitor generates and updates signals for controlling each of an adaptive predistortion unit and a vector modulator of a preamplification signal processing loop, and a vector modulator of a feed-forward error extraction and reinjection loop. A performance monitoring routine subjects monitored aliased data to a window function and determines the spectrum of the data. The spectral data is applied to a sensitivity mask, which masks the data in accordance with a carrier—intermodulation distortion function associated with the operation of the amplifier. The output of the mask is processed to derive a measure of intermodulation distortion power. The intermodulation distortion power is subjected to an error minimization operator, such as a perturbational gradient search, that adjusts each of the control signals for the components of the loops, in such a manner as to maximally cancel intermodulation distortion products.

20 Claims, 3 Drawing Sheets

ALIASED WIDE BAND PERFORMANCE MONITOR FOR ADJUSTING PREDISTORTION AND VECTOR MODULATOR CONTROL PARAMETERS OF RF AMPLIFIER

FIELD OF THE INVENTION

The present invention relates in general to communication systems, and is particularly directed to a new and improved digital signal processor-resident performance monitor for an RF power amplifier. The performance monitor is operative to process aliased data representative of amplifier distortion so as to define and controllably update control parameter signals for controlling the operation of an adaptive predistortion unit and a vector modulator of a preamplification signal processing loop, and the vector modulator of a feed-forward error correction and reinjection loop, so as to minimize or maximally cancel intermodulation distortion products in the signal path through the amplifier.

BACKGROUND OF THE INVENTION

Communication service providers are subject to very strict bandwidth usage spectrum constraints, such as technically mandated specifications and regulations imposed by the Federal Communications Commission (FCC), which currently requires that sideband spillage, namely the amount of energy spillover outside a licensed band of interest, be sharply attenuated (e.g., on the order of 60 dB). While such limitations are adequate for traditional forms of modulation such as frequency modulation (FM), they are difficult to achieve using more contemporary, digitally based modulation formats, such as M-ary modulation.

Keeping the sidebands attenuated sufficiently to meet industry or regulatory-based requirements using such modulation techniques mandates the use of very linear signal processing systems and components. Although linear components can be implemented at a reasonable cost at relatively low bandwidths (baseband) used in telephone networks, linearizing such components, especially RF power amplifiers, becomes a very costly exercise.

RF power amplifiers are inherently non-linear devices, and generate unwanted intermodulation distortion products (IMDs), which manifest themselves as spurious signals in the amplified RF output signal, separate and distinct from the RF input signal. This intermodulation distortion is also referred to as spectral regrowth, or spreading of a compact spectrum into spectral regions that do not appear in the RF input signal. The distortion introduced by an RF amplifier causes the phase and amplitude of its amplified output signal to depart from the respective phase and amplitude of the input signal, and may be considered as an incidental (and undesired) amplifier-sourced modulation of the input signal.

One brute force technique for linearizing an RF power amplifier is to build the amplifier as a large, high power device and then operate the amplifier at a low power level that is only a small percentage of its rated output power, where the RF amplifier's transfer function is relatively linear. An obvious drawback to this approach is its overkill penalty—high cost, large size and poor efficiency. Other proposals to account for RF amplifier degradation include coupling a 'pre-processing' correction loop in the path of the amplifier's input signal, and/or coupling a 'post-processing', feed-forward correction loop with the amplifier's output signal.

The purpose of a preprocessing correction loop is to modify the RF amplifier's input signal path. Ideally the control signal causes the signal path adjustment mechanism to produce a signal control characteristic that has been predetermined to be equal and opposite to the distortion expected at the output of the RF amplifier. As a consequence, when subjected to the transfer function of the RF amplifier, it will optimally effectively cancel the amplifier's anticipated distortion behavior. The mechanism may be made adaptive by extracting the RF error signal component in the output of the RF amplifier and adjusting the control signal in accordance with the such extracted error behavior of the RF amplifier during real time operation, so as to effectively continuously reduce distortion in the amplifier's output.

A post-processing, feed-forward correction loop serves to extract the amount of RF error (distortion) present in the RF amplifier's output signal, amplify that extracted distortion signal to the proper level, and then reinject the inverse of the amplified RF error signal back into a downstream output path of the RF amplifier, so that (ideally) the amplifier distortion is effectively canceled. To extract the error, the output of the RF amplifier is combined in an RF cancellation combiner with the RF input signal (which is used as a reference), in order that all carrier components (which give rise to the intermodulation distortion products) are effectively canceled, leaving only the RF error.

In the past, mechanisms for reducing such RF carrier components have involved the use of analog phase and amplitude adjustment circuits, which attempt to align the phase and amplitude of the two RF signals by the use of differential amplifier and phase detector circuitry installed in one or both RF signal paths. In addition, pilot tone injection and measurement units installed in the amplifier output path, upstream and downstream of a feed-forward error correction and reinjection location have been used. Because these conventional parameter monitoring and adjustment subsystems are stand-alone and autonomously controlled components, they not only increase the complexity and expense of an overall amplifier architecture, but rely on parameters other than the actual RF signals of interest (e.g., a pilot tone outside the desired spectrum).

SUMMARY OF THE INVENTION

In accordance with the present invention, these shortcomings of the prior art are effectively eliminated by an aliased digital signal processor-resident RF power amplifier performance monitor. As will be described, this performance monitor is operative to update control parameter signals in a manner that effectively minimizes or maximally cancels intermodulation distortion products in the signal path through the amplifier. The control parameter signals are used to control the operation of each of an adaptive predistortion unit and a vector modulator of a preamplification signal processing loop, as well as the operation a vector modulator of a feed-forward error correction and reinjection loop.

Within the preamplification signal processing loop, to which an RF signal input port is coupled, the adaptive predistortion unit is coupled to receive a set of weighting coefficients supplied by the digital signal processor, while the vector modulator has respective amplitude/gain and phase control inputs to which amplitude and phase adjustment signals ($G_1$, $\Phi_1$) are supplied by the processor.

The RF input port is further coupled to an RF carrier cancellation combiner of the feed-forward error correction and reinjection loop. A portion of the amplified signal output of the RF amplifier (representative of the amplified original RF input signal and any intermodulation (spectral regrowth) distortion products (IMDs) introduced by the amplifier) is also coupled to the carrier cancellation combiner. The cancellation combiner serves to cancel all carrier components (which give rise to the intermodulation distortion products), leaving only the RF error.

The RF error signal produced by the RF cancellation combiner is coupled to a vector modulator of the feed-forward error correction and reinjection loop. The output of the vector modulator is amplified in a feed-forward error amplifier, and then reinjected into the output path of the RF amplifier. The vector modulator of the feed-forward injection loop has respective amplitude and phase control inputs, to which respective amplitude and phase adjustment signals ($G_2$, $\Phi_2$) are supplied by the performance monitoring processor.

In order for the processor to monitor and adaptively control the performance of the RF signal processing components of the RF amplifier, the output of the RF carrier cancellation combiner (representative of the intermodulation distortion products in the output of the RF amplifier) and the composite signal in the reinjected output path of the RF amplifier are controllably coupled through a loop monitoring switch to a down-converting mixer, the output of which is coupled to wideband sub sampling analog-to-digital converter.

Because the signals are sub-sampled, the output of the analog-to-digital converter is less than the Nyquist criterion and therefore is 'aliased' data. The digitized aliased data is buffered through a first-in, first-out (FIFO) serial buffer, so that it may be transferred at a data rate that is compatible with the processing speed of the processor. The sub sampled data is processed in accordance with a performance monitoring and control parameter updating processing routine which is operative to update the weighting coefficients to the predistortion compensation unit, and the two sets of amplitude and phase control signals for the two vector modulators. The processed data produces updated values that are converted to analog format by a digital-to-analog converter and applied to the predistortion unit and the vector modulators.

The performance monitoring routine produces respective products of a respective block of data samples and a window function WIN, such as a conventional Blackman-Harris window function. The respective components of the window function WIN are multiplied by successive samples of the data samples, to produce a sequence Y of product outputs, where a respective product $y_i = y_i * WIN_i$. The time domain samples $y_i$ are processed into spectrum samples $S_i = FFT\{y_i * WIN\}$ by a multiplication with a time domain window, followed by a Fourier transform, such as a conventional Fast Fourier Transform (FFT) algorithm as a non-limiting example. The samples $S_i$ are multiplied by successive components $M_i$ of a sensitivity mask function M, which represents a known carrier versus intermodulation distortion function associated with the operation of the RF amplifier.

A sequence of product values $h_i = S_i * M_i$ is used to derive a measure of the intermodulation distortion power P representative of the overall intermodulation distortion power in the processed set of data samples. This IMD power data is processed in accordance with an error minimization operator through which the controlled parameters w, G and $\Phi$ are controllably adjusted. As a non-limiting example, the error minimization operator may comprise sequential, maximal descent, perturbational gradient search mechanism.

To generate the sensitivity mask function M, the mask is reset to all ones. This allows all spectral components to be observed. Next, the maximum value $S_{max}$ of the sequence of spectral power values $S_i$ as produced by the conjugate and multiply function is identified. It may be noted that carrier and intermodulation distortion (IMD) energy is present when $S_{max}$ is evaluated. An upper limit value $T_U$ is defined as: $T_U = S_{max} * B_U$, where $B_U$ is the upper bound for detected intermodulation distortion products. A lower limit value $T_L$ is defined as: $T_L = S_{max} * B_L$, where $B_L$ is the lower bound for detected intermodulation distortion products, and an upper bound for noise. The value of $S_i$ is compared with the upper and lower limit values $T_U$ and $T_L$. As long as $S_i$ falls between the upper and lower limits, $M_i$ is set at 1. Otherwise, $M_i$ is set to 0.

The frequency at which the control parameters ($w_{1-n}$, $G_1$ and $\Phi_1$) of the preamplification signal processing loop, and the control parameters ($G_2$ and $\Phi_2$) of the feed-forward error correction and reinjection loop are updated is determined in accordance with the operation of the loop monitoring switch. Setting the initial values for and adjusting the sensitivity mask, as well as the control parameters for the loops is performed by controlling connectivity through the switch to couple downconverted data representative of the composite RF signal, subsequent to error signal reinjection in the RF amplifier's signal output path, to the processor. The rate at which connectivity through the switch is changed between loop-coupling input ports is determined by the intended rate of adaptation and monitored error variation.

In order to establish the control parameters for the vector modulator of the preamplification signal processing loop, the switch is initially coupled to the input signal flow path. The signal spectrum is evaluated and a carrier (sensitivity) mask Mnew is defined. Next, an average mask value Mave is set equal to a previous mask value Mold*A+(1–A)*Mnew, where A is a constant less than 1. To maximize error extraction, the switch is then coupled to monitor the output of the RF carrier cancellation combiner. As data is collected, the spectrum is reevaluated. The spectrum data are multiplied by (1–Mi), so as to effectively leave only the carrier power in the resulting sum. The gain and phase control parameters ($G_1$ and $\Phi_1$) for the vector modulator of the preamplification signal processing loop 20 are then adjusted so as to minimize carrier power, using a perturbational algorithm, such as a sequential, maximal descent, perturbational gradient search algorithm.

To set the control parameters for the vector modulator of the feed-forward error extraction and reinjection loop, the switch is initially coupled to the amplified signal output path. The spectrum is evaluated and a carrier mask Mnew is defined. Next an average mask value Mave is set equal to a previous mask value Mold*A+(1–A)*Mnew, where A is a constant less than 1. To maximize error cancelation due to reinjection, the switch is maintained coupled to the amplified signal output path. Next, data is collected from the amplified output path, and the spectrum is evaluated. The spectrum data are multiplied by Mi, so as to effectively leave only the intermodulation distortion power in the resulting sum P as follows:

$$P = \sum_{i}^{N} S_i * M_i$$

where N is the number of spectrum samples.

The gain and phase control parameters ($G_2$ and $\Phi_2$) for the vector modulator are then adjusted so as to minimize or maximally cancel the intermodulation distortion power, using a perturbational algorithm.

For setting the predistortion weights $w_i, \ldots, w_n$ of the predistortion unit of the preamplification signal processing loop, the switch is initially coupled to the input signal flow path. The spectrum is evaluated and a carrier mask Mnew is defined. To minimize intermodulation distortion at the output of the power amplifier using the predistortion unit, the switch is then coupled to monitor the output of the RF carrier cancellation combiner. Next, data is collected from the output of cancellation combiner, and the spectrum is evaluated. The spectrum data are multiplied by Mave, so as to effectively leave only intermodulation power in the resulting sum P. The predistortion weights $w_i, \ldots, w_n$ are then adjusted to minimize the resulting sum, using a perturbational algorithm.

DETAILED DESCRIPTION

Figure 1:
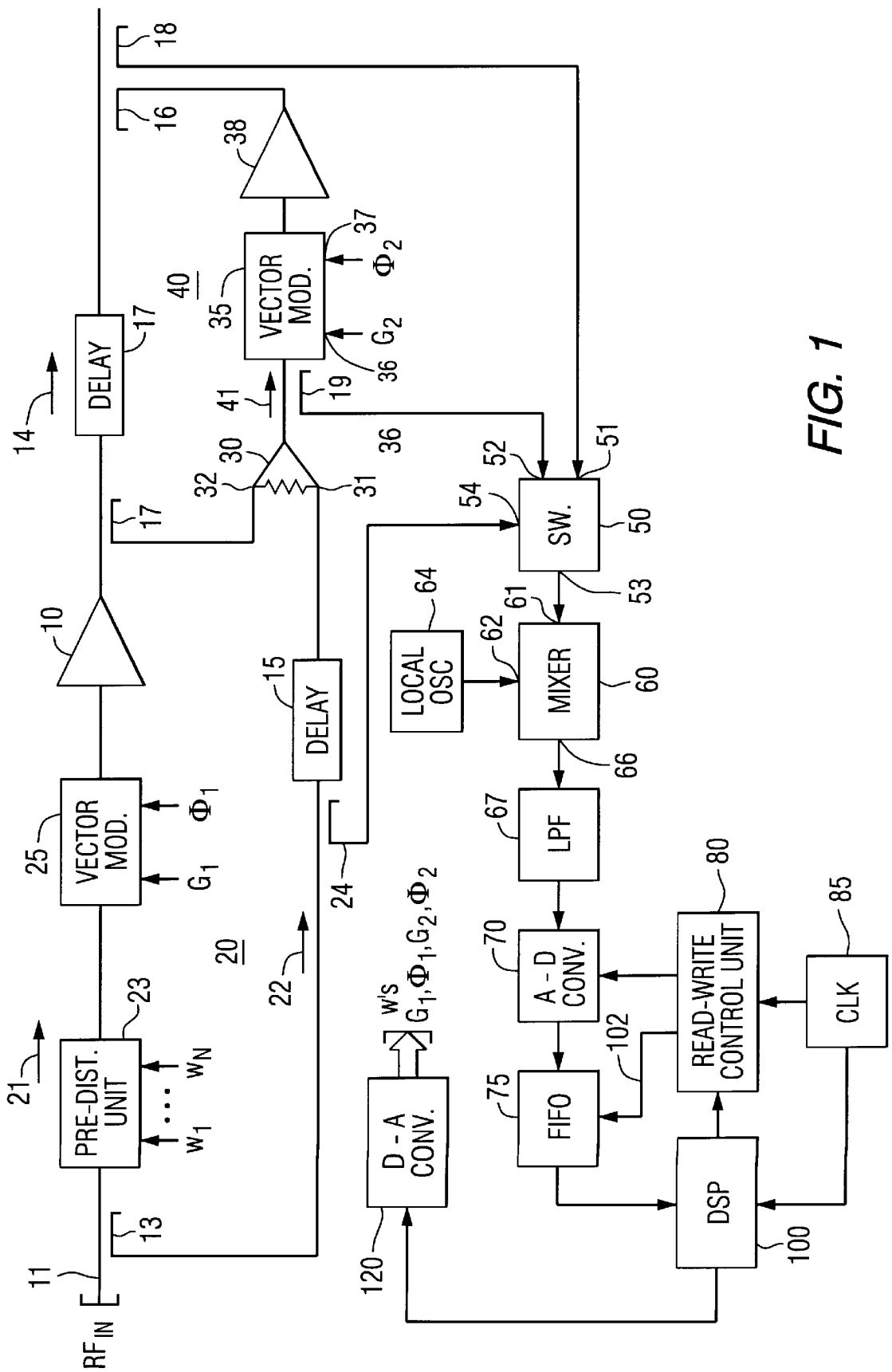
FIG. 1 diagrammatically illustrates the architecture of a non-linear RF power amplifier architecture, which incorporates the aliased wide band performance monitor of the present invention.

Before describing in detail the aliased wide band performance monitor of the present invention, it should be observed that the invention primarily resides in what is effectively a prescribed arrangement of conventional communication circuits and associated digital signal processing components and attendant supervisory control routines, that control the operations of such circuits and components. As a consequence, the configuration of such circuits and components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to present the major components of the system in a convenient functional grouping and signal processing sequence, whereby the present invention may be more readily understood.

The architecture of a non-linear RF power amplifier architecture, which incorporates the aliased wide band performance monitor of the present invention, is diagrammatically illustrated in FIG. 1 as comprising an RF input port 11, to which an RF signal to be amplified by a non-linear RF amplifier 10 is coupled. The RF input port 11 is coupled to a first RF signal flow path 21 that includes an adaptive predistortion unit 23 and a first vector modulator 25 of a preamplification signal processing loop 20. Adaptive predistortion unit 23, which may comprise a set of RF gain and phase adjustment weights, is coupled to receive a set of weighting coefficients $w_0, w_1, w_2, \ldots, w_N$, supplied by a performance monitoring and parameter updating digital signal processor (DSP) 100; similarly, vector modulator 25, which may comprise an RF amplitude and phase adjustment circuit, has respective amplitude/gain (G) and phase ($\Phi$) control inputs 26 and 27, to which first amplitude and phase adjustment signals ($G_1, \Phi_1$) are supplied by DSP 100, as will be described. These control signals cause the vector modulator 25 to maximize cancellation of RF carrier signals, so as to leave only RF error.

Input port 11 is further coupled via a directional coupler 13 to a second RF signal flow path 22 of preamplification signal processing loop 20. Directional coupler 13 thus extracts a portion of the input RF signal, prior to its being subjected to the non-linear amplification operation of the RF amplifier 10. The preamplification signal processing loop 20 includes a delay circuit 15, the output of which is coupled to a first port 31 of an RF carrier cancellation combiner 30 (e.g., a Wilkinson splitter/combiner, as a non-limiting example) of a feed-forward error extraction and reinjection loop 40. Delay circuit 15 is operative to provide a delay corresponding to the insertion delay imparted to the first RF signal flow path 21 by the adaptive predistortion unit 23, vector modulator 25 and RF amplifier 10.

A portion of the amplified signal output of the RF amplifier 10 is extracted via a directional coupler 17 and coupled to a second port 32 of carrier cancellation combiner 30. The output of the directional coupler 17 is representative of the amplified original RF input signal and any intermodulation (spectral regrowth) distortion products (IMDs) introduced by the non-linear RF amplifier 10. Cancellation combiner 30 is operative to cancel the delayed (time aligned) RF carrier component supplied by the second RF signal flow path 22 from the output of the RF amplifier 10, and thus provide an RF error signal representative of the IMDs introduced by the RF amplifier 10.

The RF error signal produced by RF cancellation combiner 30 is coupled to a second vector modulator 35 of a feed-forward error correction and reinjection loop 40. The output of the vector modulator 35 is amplified in a feed-forward error amplifier 38, and then reinjected into the output path 14 of the RF amplifier 10 by way of a reinjection directional coupler 16. Vector modulator 35 has respective amplitude and phase control inputs 36 and 37, to which respective amplitude and phase adjustment signals ($G_2, \Phi_2$) are supplied by the digital signal processor 100, as will be described.

The reinjection directional coupler 16 is installed in the RF amplifier's output path 14, downstream of a delay unit 17 to which the output of RF amplifier 10 is coupled. Delay unit 17 provides an effective delay corresponding to the insertion delay of the components in an RF error signal flow path 41 through the RF cancellation combiner 30, vector modulator 35 and error amplifier 38 of the feed-forward error contained in the feed-forward error correction and reinjection loop 40.

In order to monitor and adaptively control the performance of the RF signal processing components of the RF amplifier architecture of FIG. 1, the digital signal processor 100 is coupled to each of the preamplification signal processing loop 20, and the feed-forward error correction and reinjection loop 40. For this purpose, a portion of the output of the RF carrier cancellation combiner 30 is extracted via a directional coupler 19 and is supplied to a first input port 52 of a loop monitoring switch 50, an output port 53 of which is digitized by a sub-sampling wideband analog-to-digital converter 70 and supplied to DSP 100.

The output of the directional coupler 19 is representative of the intermodulation distortion products in the output of the RF amplifier 10. In addition, a portion of the composite signal in the RF amplifier's signal output path 14 is extracted via a directional coupler 18 installed downstream of reinjection directional coupler 16, and is applied to a second input port 51 of switch 50. In addition, via a directional coupler 24, a portion of the RF signal flow path 22 is coupled to a further input 54 of switch 50. As will be described, these signals are used by DSP 100 to adjust weighting coefficients ($w_1$–$w_n$) supplied to the predistortion compensation unit 23 and the amplitude (G) and phase (Φ) control signals for each of vector modulators 25 and 35.

More particularly, the output port 53 of switch 50 is coupled to a first port 61 of a mixer 60. A second port 62 of mixer 60 is coupled to the output of a downconverting local oscillator 64. The (IF) output 66 of mixer 60 is coupled through a low pass filter 67 and then digitized by a wideband analog-to-digital converter (ADC) 70, at a prescribed sampling rate and data resolution (e.g., 65 Ms/s, with a code width of twelve bits per sample, as a non-limiting example), which may be less than the bandwidth of the down converted (IF) signals plus distortion. Being less than the bandwidth of the down-converted IF signals plus distortion, the sampling rate of the ADC 70 is necessarily less than the Nyquist criterion (which is twice the bandwidth of the signals being sampled). As a consequence, the digitized sub-sampled data is actually an aliased signal—hence, the term 'aliased' wideband performance monitor of the present invention. The digitized sample data produced by ADC 70 is buffered through a first-in, first-out (FIFO) serial buffer 75, so that it may be transferred at a data rate that is compatible with the processing speed of digital signal processor 100. For this purpose, the contents of buffer 75 are controllably coupled to DSP 100 in prescribed sets or blocks (e.g., 4096 samples per block, as a non-limiting example) to digital signal processor 100, under the control of a transfer request signal applied over a transfer control line 102 from a write-read control unit 80, such as a complex programmable logic device, which controls the sampling by ADC 70 and the data transfer through buffer 75 in accordance with a local clock circuit 85.

As successive blocks of sampled data are controllably coupled from the FIFO buffer 75 into DSP 100, they are processed in accordance with performance monitoring and control parameter updating processing routines resident in DSP 100 (to be described below with reference to FIGS. 2–3), so as to update the weighting coefficients $w_0$, $w_1$, $w_2$, ..., $w_N$ to the predistortion compensation unit 23, and the two sets of amplitude and phase control signals ($G_1$, $\Phi_1$, $G_2$, $\Phi_2$) for vector modulators 25 and 35, as will be described. The digital weighting coefficient values $w_0$, $w_1$, $w_2$, ..., $w_N$, and the amplitude and phase adjustment values ($G_1$, $\Phi_1$, $G_2$, $\Phi_2$) produced by DSP 100 are converted to analog format by a digital-to-analog converter (DAC) 120, and applied therefrom to predistortion unit 23, and vector modulators 25 and 35.

The performance monitoring routine executed by DSP 100, for controlling the operation of the RF signal processing architecture of FIG. 1, is operative to process a respective block D of data (4096 samples) read out of FIFO buffer 75. The time domain samples $y_i$ are processed into spectrum samples $S_i$=FFT{$y_i$*WIN} by multiplication with a time domain window (WIN), followed by a Fourier transform. As a non-limiting example, a conventional Fast Fourier Transform (FFT) may be employed.

The window function (WIN) aids in the dynamic range of the spectrum of transferred samples. As pointed out above, as a non-limiting example, the window function WIN may comprise a conventional Blackman-Harris window function. Described below are signal processing operations carried out by processor 100 for deriving gain and phase parameters for vector modulator 25 of the preamplification signal processing loop 20 and for the vector modulator 35 of feed-forward error extraction and reinjection loop 40, and for deriving weighting coefficients for predistortion unit 23 of the preamplification signal processing loop 20.

Vector Modulator 25

The output port 53 of switch 50 is initially set to input port 54, which is coupled to the signal flow path 22 via directional coupler 24. The spectrum is evaluated and a carrier (sensitivity) mask Mnew is defined. (The manner in which a carrier sensitivity mask function M is derived will be described below with reference to FIG. 2.) Next, an average mask value Mave is set equal to a previous mask value Mold*A+(1−A)*Mnew, where A is a constant less than 1. To optimize error extraction, the output port 53 of switch 50 is coupled to input port 52, so as to monitor the output of RF carrier cancellation combiner 30 via directional coupler 19. Next, data is collected from the output of the combiner 30, and the spectrum is reevaluated. The spectrum data ("Si" samples) are multiplied by (1−Mi), so as to effectively leave only the carrier power in the resulting sum. The gain and phase control parameters ($G_1$ and $\Phi_1$) for the vector modulator 25 are then adjusted so as to minimize carrier power, using a perturbational algorithm, such as a sequential, maximal descent, perturbational gradient search algorithm, to be described below with reference to FIG. 3.

Vector Modulator 35

The output port 53 of switch 50 is again initially set to input port 51, which is coupled to the amplified signal output path 14, via directional coupler 18. The spectrum is evaluated and a carrier mask Mnew is defined. Next an average mask value Mave is set equal to a previous mask value Mold*A+(1−A)*Mnew, where A is a constant less than 1. To optimize error reinjection, the output port 53 of the switch 50 is maintained at input port 51. Next, data is collected from the output of directional coupler 18, and the spectrum is evaluated. The spectrum data ("Si" samples) are multiplied by Mi, so as to effectively leave only the intermodulation distortion power in the resulting sum P as follows:

$$P = \sum_i^N S_i * M_i$$

where N is the number of spectrum samples.

Figure 3:
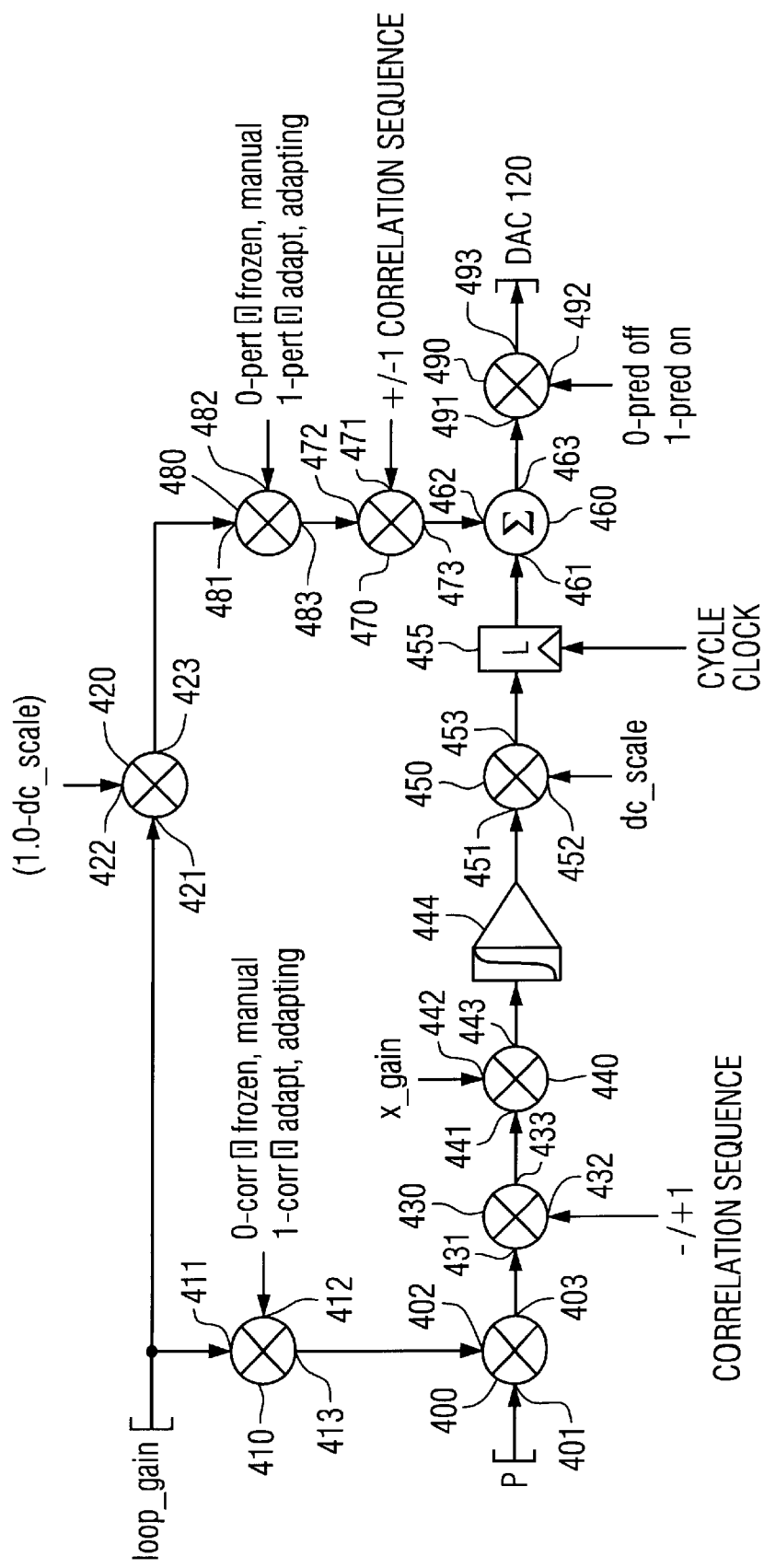
FIG. 3 diagrammatically illustrates a sequential, maximal descent, perturbational gradient search mechanism for processing the measure of intermodulation distortion.

The gain and phase control parameters ($G_2$ and $\Phi_2$) for the vector modulator 35 are then adjusted so as to minimize or maximally cancel the intermodulation distortion power, using a perturbational algorithm, such as that shown in FIG. 3, to be described.

Predistortion Unit 23

The output port 53 of switch 50 is again initially set to input port 54, which is coupled to the signal flow path 22 via directional coupler 24. The spectrum is evaluated and a carrier mask Mnew is defined. To minimize intermodulation distortion at the output of the power amplifier 10 using the predistortion unit 25, the output port 53 of switch 50 is then coupled to input port 52, so as to monitor the output of RF carrier cancellation combiner 30. Next, data is collected from the output of combiner 30 via directional coupler 19, and the spectrum is evaluated. The spectrum data ("Si" samples) are multiplied by Mave, so as to effectively leave only intermodulation power in the resulting sum P. The predistortion weights $w_i$, ..., $w_n$ are then adjusted to minimize the resulting sum, using a perturbational algorithm, such as that shown in FIG. 3, to be described.

Figure 2:
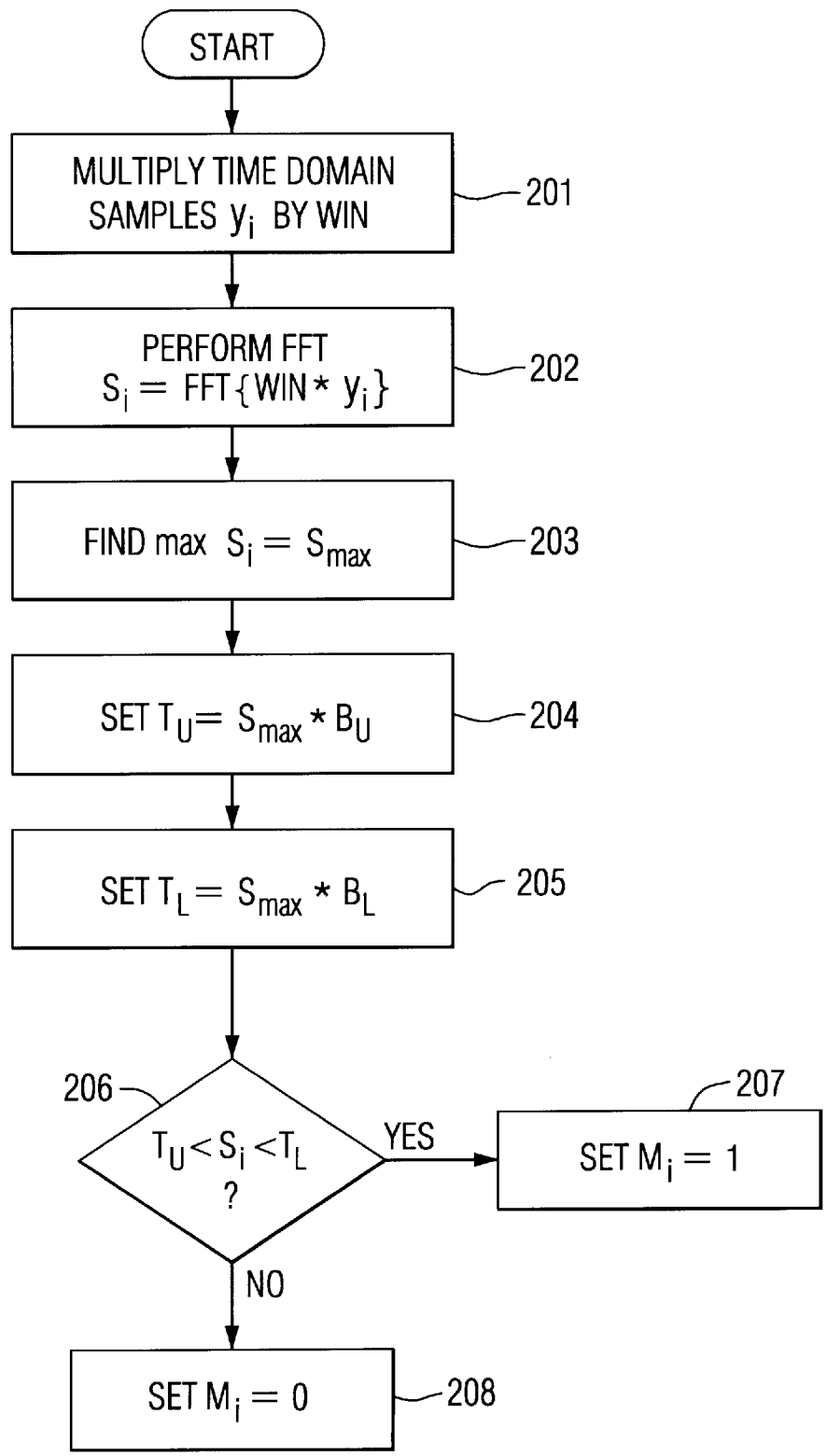
FIG. 2 is a signal processing routine for generating a carrier sensitivity mask function M.

Carrier Sensitivity Mask (FIG. 2)

The sensitivity mask function M is generated in accordance with the signal processing routine shown in the flow chart of FIG. 2. In step 201, time domain samples $y_i$ are multiplied by a time domain window function WIN to obtain $y_i$*WIN. In step 202, a sequence of spectral power value estimates $S_i$=FFT{$y_i$*WIN} is obtained by performing a Fourier transform, such as a conventional Fast Fourier Transform (FFT) algorithm as a non-limiting example. Next, in step 203, the maximum value $S_{max}$ of $S_i$ is obtained.

In step 204, an upper limit value $T_U$ is defined as: $T_U=S_{max}*B_U$, where $B_U$ is the upper bound for detected intermodulation distortion products. (As a non-limiting example, for a maximum value of 20 dB, $B_U$ may be set at 0.01.) Similarly, in step 205, a lower limit value $T_L$ is defined as: $T_L=S_{max}*B_L$, where $B_L$ is the lower bound for detected intermodulation distortion products, and an upper bound for noise. (As a non-limiting example, for a value of 60 dB, $B_L$ may be set at 0.000001.) In step 206, the value of $S_i$ is compared with the upper and lower limit values $T_U$ and $T_L$. As long as $S_i$ falls between the upper and lower limits, namely $T_L<S_i<T_U$, $M_i$ is set at a value of 1 (step 207). Otherwise, in step 208, $M_i$ is set to a value of 0.

FIG. 3 diagrammatically illustrates a sequential, maximal descent, perturbational gradient search mechanism, to which the IMD power P derived as described above is applied, for controllably adjusting or updating respective ones of the predistortion weight parameters $w_1-w_n$, and the vector modulator gain and phase parameters G and Φ. The error power P is applied as a first input 401 to a multiplication operator 400, a second input 402 is coupled to the product output 413 of an adaptation multiplier 410. Multiplier 410 has a first input 411 coupled to receive a loop gain parameter (loop_gain), which is normally a constant and serves to control the speed of adaptation of the gradient search. A second input 412 of multiplier 410 is coupled to receive a correlation control parameter (0 for a fixed, manual setting, or 1 for adaptive operation). The loop_gain value is further coupled to a first input 421 of a scaling multiplier 420, a second input of which receives a parameter equal to the difference between 1.0 and a dc_scale value. The parameter dc_scale is used to establish the step size of the gradient search.

The output 403 of multiplier 400 is coupled to a first input 431 of a correlation sequence multiplier 430, a second input 412 of which receives a correlation sequence control input (+/−1), that is operative to provide negative feedback. The output 433 of multiplier 430 is coupled to a first input 441 of a multiplier 440, a second input 442 of which is coupled to receive the parameter x_gain, a stabilizing scaling factor, similar to loop_gain, where 'x' corresponds to parameter of interest (w, G or Φ) being controlled/adjusted.

The output 443 of multiplier 440 is integrated at 444 and applied as a first input 451 to a scaling multiplier 450. A second input 452 of multiplier 450 is coupled to receive the dc_scale value which, as noted above, is used to control the step size of the gradient search. The output 453 of scaling multiplier 450 is controllably gated through a latch 455 in accordance with a cycle clock, that determines how often the new adapted parameter value of interest (x) is coupled to the DAC 120, so as to be applied therefrom to one of the predistortion unit 23, and vector modulators 25 and 35. The updated value of x is coupled to a first input 461 of an adder 460.

A second input 462 of adder 460 is coupled to the output 473 of a correlation sequence multiplier 470, a first input 471 of which receives a correlation sequence control input (−/+1), which is opposite to that applied to correlation sequence multiplier 430, described above. A second input 472 of multiplier 470 is coupled to the output 483 of a perturbation scaling multiplier 480, a first input 481 of which is coupled to the output 423 of scaling multiplier 420. Multiplier 480 has a second input 482 coupled to receive a perturbation control parameter (0 for a fixed, manual setting, or 1 for adaptive operation).

The output 463 of adder 460 is coupled to a first input 491 of a multiplier 490 which effectively serves as a switch control function for controllably coupling the updated parameter 'x' to the associated input of the respectively adjusted component of the RF signal processing architecture of FIG. 1. A second (binary) input 492 of multiplier 490 receives either 1 or 0, in accordance with whether or not the control parameter is to be updated. The output 493 of multiplier 490 is coupled to DAC 120, which provides a corresponding analog voltage to an associated control input of one of the predistortion unit 23, and vector modulators 25 and 35.

As described briefly above, the frequency at which the control parameters ($w_1-w_n$, $G_1$ and $Φ_1$) of the preamplification signal processing loop 20, and ($G_2$ and $Φ_2$) of the feed-forward error correction and reinjection loop 40 are updated is determined in accordance with the operation of the loop monitoring switch 50. Setting the initial values for and adjusting the sensitivity mask, as well as the gain and phase control values $G_2$, $Φ_2$ for the vector modulator 35 of the feed-forward error correction and reinjection loop 40 is performed by providing throughput connectivity between ports 51 and 53 of the switch, thereby coupling data representative of the composite RF signal, subsequent to error signal reinjection in the RF amplifier's signal output path 14, to the DSP 100. Updating the weighting coefficients w for the adaptive predistortion unit 23 and the gain and phase control values $G_1$, $Φ_1$ for the vector modulator 25 of the preamplification signal processing loop 20 is performed by providing throughput connectivity between ports 51 and 52 of the switch 50, thereby supplying intermodulation distortion products at the output of the RF carrier cancellation combiner 30 to ADC 70 for application to DSP 100. The rate at which connectivity through the switch 50 is changed between input ports 51 and 52 is determined by the intended rate of adaptation and monitored error variation.

As will be appreciated from the foregoing description, the shortcomings of conventional RF power amplifier performance monitoring schemes, which employ autonomously controlled components, including analog amplitude and phase measurement and pilot tone injection and measurement circuitry installed in various RF signal paths, are effectively eliminated by the integrated digital signal processor-resident RF power amplifier performance monitor of the present invention. This integrated scheme, which monitors the actual signals through the system, is able to successfully establish and update control parameter signals for controlling the operation of each of an adaptive predistortion unit and a vector modulator of a preamplification signal processing loop, and that of a vector modulator of a feed-forward error correction and reinjection loop are controllably updated in a manner that effectively minimizes or maximally cancels intermodulation distortion products in the signal path through the amplifier.

While I have shown and described an embodiment in accordance with the present invention, it is to be understood that the same is not limited thereto but is susceptible to numerous changes and modifications as are known to a person skilled in the art, and I therefore do not wish to be limited to the details shown and described herein, but intend to cover all such changes and modifications as are obvious to one of ordinary skill in the art.

What is claimed:

1. For use with an RF power amplifier having a first, preamplification signal processing loop installed in a signal flow path upstream of said RF power amplifier, and a second, feed-forward error correction and reinjection loop installed in a signal flow path downstream of said RF power amplifier, each of said first and second loops containing controllable signal processing components, a performance monitor for monitoring the operation of said RF power amplifier and controllably adjusting said signal processing components of said first and second loops, so as to reduce intermodulation distortion products in an amplified RF output signal produced by said amplifier, said performance monitor comprising:

a carrier cancellation combiner which is coupled to combine a reference signal, representative of said RF input signal, with said amplified RF output signal, so as to cancel carrier components which give rise to the intermodulation distortion products, and thereby provide an RF error signal; and a digital signal processor, which is coupled to receive first data aliased representative of samples of said RF error signal sampled at less than the Nyquist criteria and second aliased data representative of a samples of composite signal sampled at less than the Nyquist criteria in a reinjected output signal flow path downstream of said RF power amplifier, and is operative to process said first and second aliased data and generate control signals for controllably adjusting said signal processing components of said first and second loops, in such a manner as to maximally cancel said intermodulation distortion products.

2. A performance monitor according to claim 1, wherein said first, preamplification signal processing loop includes an adaptive predistortion unit which is coupled to receive a set of weighting coefficients supplied by said digital signal processor.

3. A performance monitor according to claim 2, wherein said first, preamplification signal processing loop further includes a vector modulator installed in a signal flow path with said adaptive predistortion unit and being coupled to receive amplitude and phase adjustment signals supplied by said digital signal processor.

4. A performance monitor according to claim 1, wherein said second, feed-forward error correction and reinjection loop includes a vector modulator coupled to receive amplitude and phase adjustment signals supplied by said digital signal processor.

5. A performance monitor according to claim 1, wherein said first, preamplification signal processing loop includes an adaptive predistortion unit, the operation of which is controlled by weighting coefficient signals, a first vector modulator installed in a signal flow path with said adaptive predistortion unit and having its operation controlled by first amplitude and phase adjustment signals, and wherein said second, feed-forward error correction and reinjection loop includes a second vector modulator coupled to said carrier cancellation combiner and having its operation controlled by second amplitude and phase adjustment signals, and wherein said digital signal processor is operative to generate said weighting coefficient signals, and said first and second amplitude and phase adjustment signals, so as to maximally cancel said intermodulation distortion products.

6. A performance monitor according to claim 1, wherein the output of said second vector modulator is coupled to a feed-forward error amplifier, having its output reinjected into the output path of said RF amplifier.

7. A performance monitor according to claim 1, further including a controlled signal transfer path, coupled to said carrier cancellation combiner to said reinjected output signal flow path downstream of said RF power amplifier, and being operative to selectively couple said first and second aliased data to said digital signal processor at a data rate that is compatible with the processing speed of said processor.

8. A performance monitor according to claim 1, wherein said digital signal processor is operative to execute an intermodulation distortion power measurement routine that is operative to process the spectrum of said first and second aliased data, a carrier sensitivity mask, which masks said first and second aliased data in accordance with a carrier versus intermodulation distortion function associated with the operation of said RF amplifier, and an intermodulation distortion power derivation operator, which is operative to derive a measure of intermodulation distortion power in accordance with the output of said sensitivity mask.

9. A performance monitor according to claim 8, wherein said intermodulation distortion power measurement routine is operative to generate said sensitivity mask by deriving a maximum $S_{max}$ of a sequence of intermodulation distortion product values $S_i$, establishing an upper limit value $T_U$ as: $T_U = S_{max} * B_U$, where $B_U$ is the upper bound for said intermodulation distortion products, a lower limit value $T_L$ as: $T_L = S_{max} * B_L$, where $B_L$ is the lower bound for said intermodulation distortion products, and setting $M_i$ is set at a first value in response to $S_i$ falling between said upper and lower limits, but otherwise setting $M_i$ to a second value.

10. A performance monitor according to claim 8, wherein said digital signal processor is operative to process said measure of intermodulation distortion power in accordance with a prescribed minimization operator, that generates values of said control signals for controllably adjusting said signal processing components of said first and second loops, such that said controlled components of said first and second loops values are effective to maximally cancel said intermodulation distortion products.

11. A performance monitor according to claim 10, wherein said prescribed minimization operator comprises a perturbational gradient search mechanism.

12. A method of monitoring and controlling the operation of an RF power amplifier having a first, preamplification signal processing loop installed in a signal flow path upstream of said RF power amplifier, and a second, feed-forward error correction and reinjection loop installed in a signal flow path downstream of said RF power amplifier, each of said first and second loops containing controllable signal processing components, said second loop further including a carrier cancellation combiner which is coupled to combine a reference signal representative of said RF input signal with said amplified RF output signal, so as to cancel carrier components which give rise to said intermodulation distortion products, and thereby provide an RF error signal, said method comprising the steps of:

(a) digitizing said RF error signal and a composite signal in a reinjected output signal flow path downstream of said RF power amplifier at a sampling rate that is less than Nyquist criteria, so as to produce aliased data representative of said RF error signal and said composite signal; and (b) processing said aliased data representative of said RF error signal and said composite signal digitized in step (a), so as to generate control signals through which said signal processing components of said first and second loops are controllably adjusted, in such a manner as to maximally cancel said intermodulation distortion products.

13. A method according to claim 12, wherein said first, preamplification signal processing loop includes an adaptive predistortion unit which is coupled to receive a set of weighting coefficients as part of said control signals generated in step (b).

14. A method according to claim 13, wherein said first, preamplification signal processing loop further includes a vector modulator installed in a signal flow path with said adaptive predistortion unit and being coupled to receive amplitude and phase adjustment signals as part of said control signals generated in step (b).

15. A method according to claim 12, wherein said second, feed-forward error correction and reinjection loop includes a vector modulator coupled to receive amplitude and phase adjustment signals as part of said control signals generated in step (b).

16. A method according to claim 12, wherein said first, preamplification signal processing loop includes an adaptive predistortion unit, the operation of which is controlled by weighting coefficient signals, a first vector modulator installed in a signal flow path with said adaptive predistortion unit and having its operation controlled by first amplitude and phase adjustment signals, and wherein said second, feed-forward error correction and reinjection loop includes a second vector modulator coupled to said carrier cancellation combiner and having its operation controlled by second amplitude and phase adjustment signals, and wherein, in step (b) comprises processing said aliased data representative of said RF error signal and said composite signal digitized in step (a), to generate said weighting coefficient signals, and said first and second amplitude and phase adjustment signals, in such a manner as to maximally cancel said intermodulation distortion products.

17. A method according to claim 12, wherein step (b) comprises executing an intermodulation distortion power measurement routine which subjects said aliased data to a window function representative of the spectrum of the aliased data, a carrier sensitivity mask, which masks said data in accordance with a carrier versus intermodulation distortion function associated with the operation of said RF amplifier, and an intermodulation distortion power derivation operator, which derives a measure of intermodulation distortion power in accordance with the output of said sensitivity mask.

18. A method according to claim 17, wherein said intermodulation distortion power measurement routine is operative to generate said sensitivity mask by deriving a maximum $S_{max}$ of a sequence of intermodulation distortion product values $S_i$, establishing an upper limit value $T_U$ as: $T_U = S_{max} * B_U$, where $B_U$ is the upper bound for said intermodulation distortion products, a lower limit value $T_L$ as: $T_L = S_{max} * B_L$, where $B_L$ is the lower bound for said intermodulation distortion products, and setting $M_i$ is set at a first value in response to $S_i$ falling between said upper and lower limits, but otherwise setting $M_i$ to a second value.

19. A method according to claim 17, wherein step (b) comprises processing said measure of intermodulation distortion power in accordance with a prescribed minimization operator, that generates values of said control signals for controllably adjusting said signal processing components of said first and second loops, such that said controlled components of said first and second loops values are effective to maximally cancel said intermodulation distortion products.

20. A method according to claim 19, wherein said prescribed minimization operator comprises a perturbational gradient search mechanism.

\* \* \* \* \*